United States Patent
Halsted

(10) Patent No.: US 8,941,366 B2
(45) Date of Patent: Jan. 27, 2015

(54) DC-DC CONVERTER HAVING AN OUTPUT THAT IS A MEASURE OF THE EFFICIENCY OF THE CONVERTER

(75) Inventor: Clint Wade Halsted, Statesville, NC (US)

(73) Assignee: Texas Instruments Incorporated, Dallas, TX (US)

( * ) Notice: Subject to any disclaimer, the term of this patent is extended or adjusted under 35 U.S.C. 154(b) by 195 days.

(21) Appl. No.: 13/532,492

(22) Filed: Jun. 25, 2012

(65) Prior Publication Data

US 2013/0342182 A1   Dec. 26, 2013

(51) Int. Cl.
*G05F 1/00* (2006.01)

(52) U.S. Cl.
USPC ............................. 323/271; 323/285; 363/78

(58) Field of Classification Search
USPC ................ 323/268, 271, 282, 284, 285, 351; 363/74, 78, 123
See application file for complete search history.

(56) References Cited

U.S. PATENT DOCUMENTS

| | | | | |
|---|---|---|---|---|
| 8,659,273 B2* | 2/2014 | McDonald et al. | ............ | 323/271 |
| 8,680,820 B2* | 3/2014 | Harrison | ........................ | 323/207 |
| 8,742,738 B2* | 6/2014 | Houston | ........................ | 323/272 |
| 2004/0188717 A1* | 9/2004 | Ono | ........................... | 257/200 |
| 2009/0179619 A1* | 7/2009 | Houston | ........................ | 323/212 |
| 2011/0309811 A1* | 12/2011 | Kondo et al. | ................. | 323/282 |

* cited by examiner

*Primary Examiner* — Jue Zhang
*Assistant Examiner* — Lakaisha Jackson
(74) *Attorney, Agent, or Firm* — William B. Kempler; Frederick J. Telecky, Jr.

(57) ABSTRACT

A DC-DC converter includes efficiency reporting circuitry having an output that is a measure of efficiency. In an example, the DC-DC converter has an input voltage, an output voltage, and a switching circuit converting the input voltage to an intermediate voltage, and the efficiency reporting circuitry determines the ratio between the output voltage and the intermediate voltage.

14 Claims, 5 Drawing Sheets

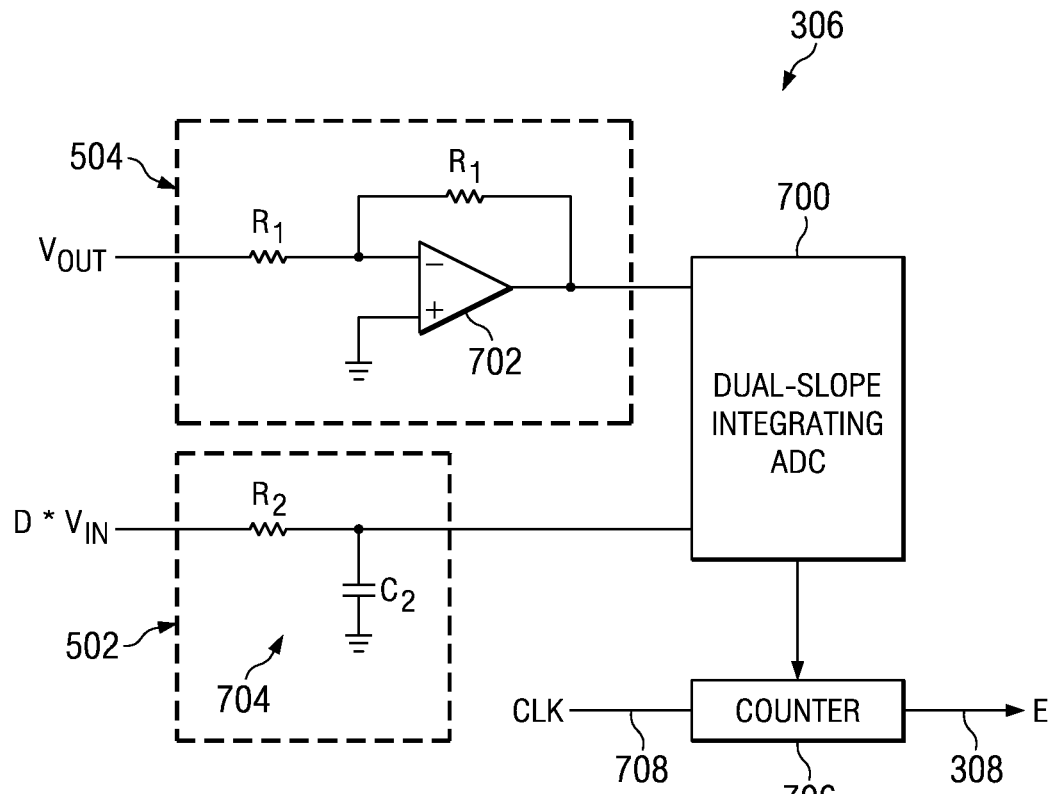
FIG. 7C
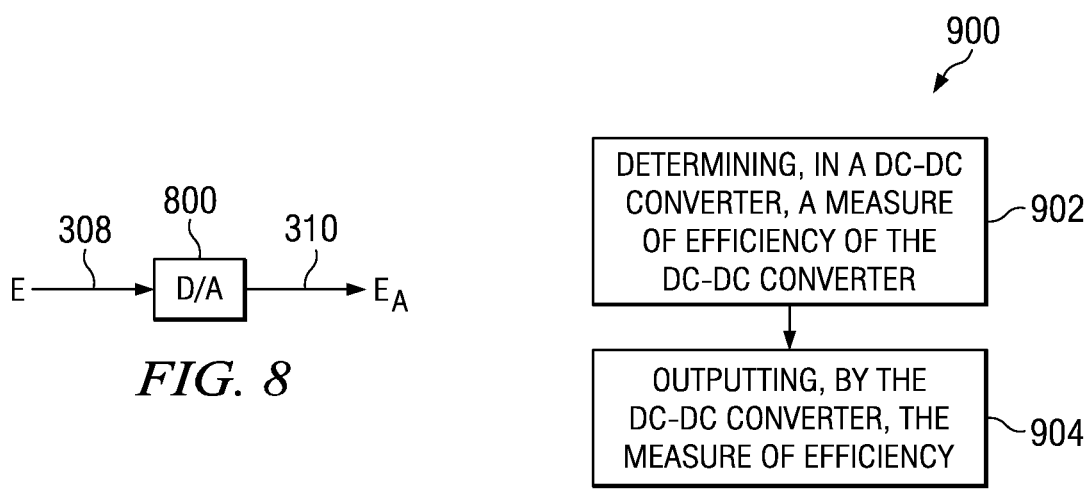
FIG. 8
FIG. 9

DC-DC CONVERTER HAVING AN OUTPUT THAT IS A MEASURE OF THE EFFICIENCY OF THE CONVERTER

BACKGROUND

A DC-DC converter is an electronic circuit that converts a source of direct current (DC) from one voltage to another. For example, DC-DC converters are widely used in portable devices to provide power from a battery. DC-DC converters may also regulate the output voltage, compensating for varying load current and variations in the input voltage.

FIG. 1A illustrates one common type of DC-DC converter. The DC-DC converter circuit 100 in FIG. 1A (simplified to facilitate illustration and description) is a switching step-down converter (the input voltage is higher than the output voltage), and the basic design is called a Buck converter. In FIG. 1A, a power source 102 provides direct current at an input voltage $V_{IN}$. The circuit 100 provides direct current to a load ($R_{LOAD}$) at an output voltage $V_{OUT}$. Two electronic switches (SW1, SW2) are controlled by a switch control circuit 106 and driver 108. At most only one switch is closed at any one time. When SW1 is closed, current from the source 102 flows into $R_{LOAD}$ and a filter capacitor (C), and $V_{OUT}$ rises linearly. In addition, when SW1 is closed, energy is stored in L and C. When SW2 is closed, current flows from stored energy in C and from stored energy in L, and $V_{OUT}$ decreases linearly. A comparator 104 compares $V_{OUT}$ to a reference voltage $V_{REF}$, and the switch control circuit 106 adjusts the duty cycle of SW1 in response to the output of comparator 104.

There are many variations in topology and control of DC-DC converters. The circuit illustrated in FIG. 1A has a single inductor. There are variations, for example, LLC, with multiple inductor resonant circuits. The circuit illustrated in FIG. 1A uses output voltage feedback. Some circuits use current feedback. Some circuits have multiple feedback loops.

In general, there is a need to verify operation of a DC-DC converter (design testing, production testing, and system testing), and, in general, there is a need for improving efficiency.

BRIEF DESCRIPTION OF THE DRAWINGS

FIG. 7C is a block diagram illustrating additional detail for part of the example embodiment of FIG. 7A.

FIG. 8 is a block diagram of additional detail for an example embodiment of part of the DC-DC converter of FIG. 3.

FIG. 9 is a flow chart illustrating an example embodiment of a method for generating a measure of efficiency for a DC-DC converter.

DETAILED DESCRIPTION

Power supplies need to be designed for efficiency, the efficiency of systems needs to be verified during operation, and loads may need to be adjusted to improve power supply efficiency. Accordingly, there is a need for a DC-DC converter that provides a measure of efficiency as an output.

Figure 1A:
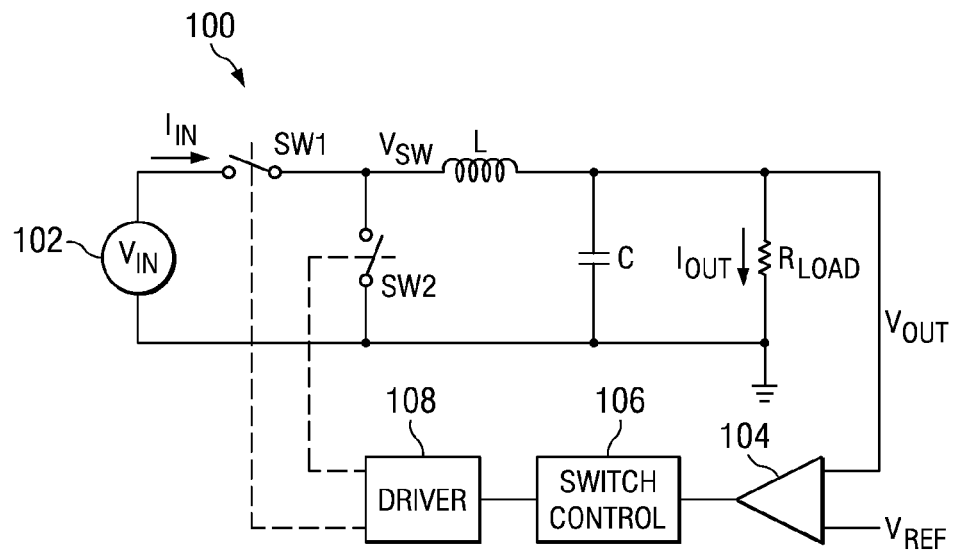
FIG. 1A is a block diagram illustrating an example prior art embodiment of a DC-DC converter.

The power efficiency E of the circuit 100 of FIG. 1A is output power divided by input power (where $V_{OUT}$, $I_{OUT}$, $V_{IN}$ and $I_{IN}$ are all DC values):

$$E = \frac{V_{OUT} * I_{OUT}}{V_{IN} * I_{IN}}$$

In general, measuring currents ($I_{IN}$ and $I_{OUT}$) adds complexity, and computing the products and division adds complexity. There is a need for a more straightforward way to measure efficiency.

The switches SW1 and SW2 in FIG. 1A switch at a duty cycle of D. That is, SW1 is closed D percent of the time. Assuming ideal switches (that is, assuming no power loss in the switches), the DC switched node voltage $V_{SW}=D*V_{IN}$. The DC output current $I_{OUT}=I_{IN}/D$. Substituting $D*I_{OUT}$ for $I_{IN}$ in the above efficiency equation, efficiency E is:

$$E = \frac{V_{OUT} * I_{OUT}}{V_{IN} * (D * I_{OUT})} = \frac{V_{OUT}}{D * V_{IN}}$$

Accordingly, for an ideal circuit, efficiency is $V_{OUT}/V_{SW}$. However, as discussed below, for an actual circuit, $V_{SW}$ is less than $D*V_{IN}$ because of switching and conduction losses in the switches. In general, there are multiple power losses that reduce efficiency. There are switching losses in the active switching circuitry, and in the circuitry driving the switches, and in the feedback circuitry. There are also conduction losses, such as switching transistor effective resistance, diode forward voltage drops, inductor winding resistance, and capacitor equivalent series resistance. In general, switching losses are insignificant except during very light load conditions. For heavy loads, efficiency is reduced primarily by conduction losses.

Figure 1B:
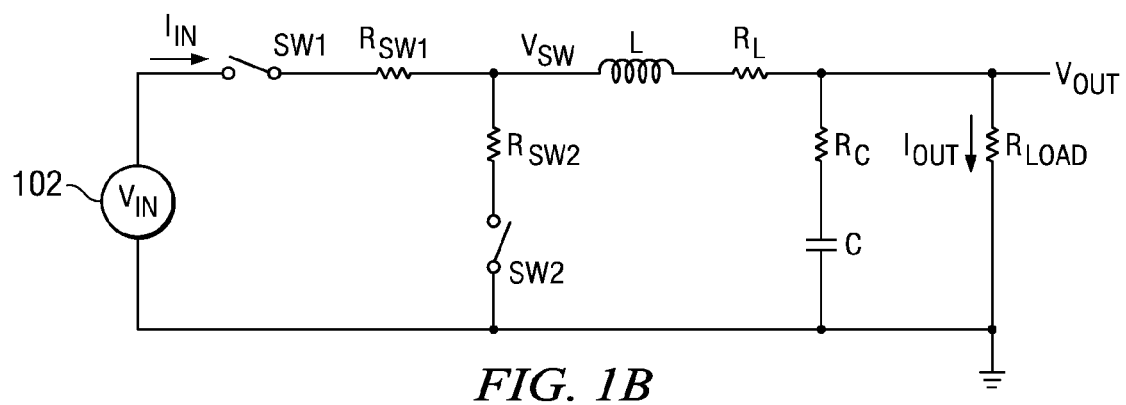
FIG. 1B is a block diagram illustrating additional detail for part of the DC-DC converter of FIG. 1A.

FIG. 1B illustrates additional detail for part of the DC-DC converter of FIG. 1A specifically illustrating effective resistances that contribute to conduction losses. In FIG. 1B, $R_{SW1}$ depicts the effective on-resistance of switch SW1, $R_{SW2}$ depicts the effective on-resistance of switch SW2, $R_L$ depicts the winding resistance of inductor L, and $R_C$ depicts the equivalent series resistance of capacitor C. In FIG. 1B, the DC switched node voltage $V_{SW}$ is less than $D*V_{IN}$ because of conductive losses in $R_{SW1}$ and $R_{SW2}$, and $V_{OUT}$ is less than $V_{SW}$ because of conductive losses in $R_L$ and $R_C$. The efficiency equation given above is still valid, but what is needed is a way to measure $D^*V_{IN}$, which is an ideal value and not an actual voltage that can be measured in the circuit of FIGS. 1A and 1B because of the losses in the switches SW1 and SW2.

One example way to measure $D^*V_{IN}$ is to build a switching circuit with an input of $V_{IN}$ and a duty cycle of D, but with negligible switching and conductive losses in the switches. In general, for MOSFET switches, switching losses are proportional to switching frequency and proportional to the values of parasitic capacitances. As the physical size of the MOSFET increases, parasitic capacitances also increase. Accordingly, switching losses can be made negligible by using very small transistors. Conductive losses can be made negligible by making the current through the switches negligible.

Figure 2:
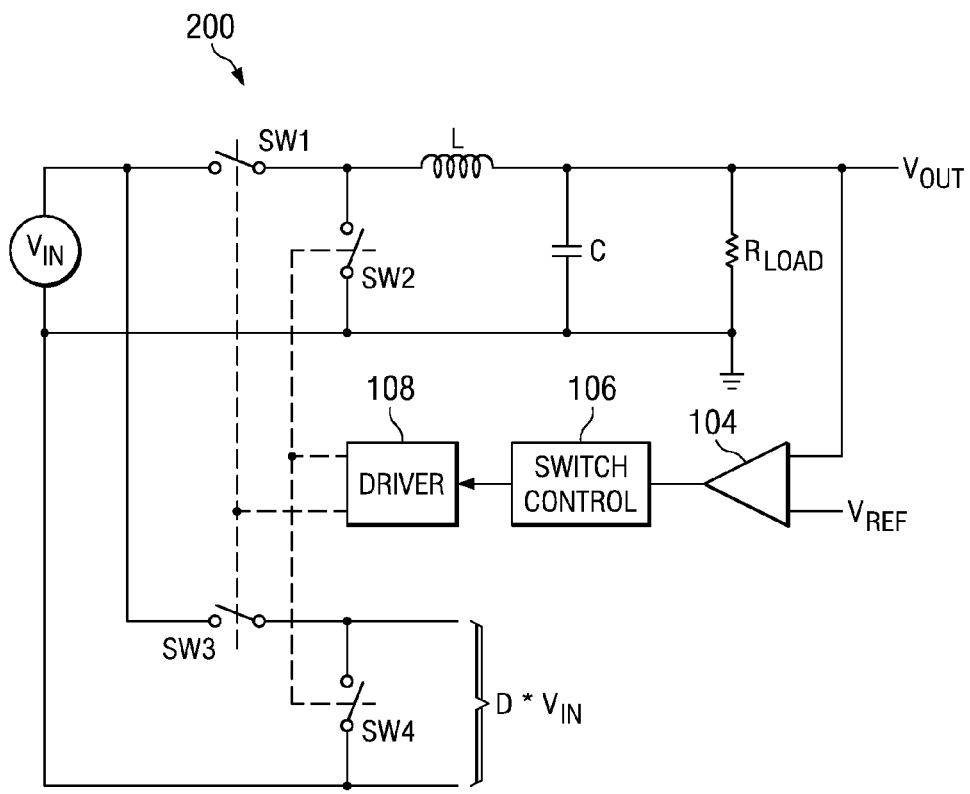
FIG. 2 is a block diagram illustrating an example embodiment of a DC-DC converter generating a voltage needed for a measure of efficiency.

FIG. 2 illustrates a DC-DC converter circuit that generates $D^*V_{IN}$. In the circuit of FIG. 2, two additional switches (SW3, SW4) have been added to the circuit of FIG. 1A. In the example of FIG. 2, driver 108 drives switch SW3 at the same time as SW1, and drives switch SW4 at the same time as SW2. Therefore, the duty cycle D for switches SW3 and SW4 is the same as for switches SW1 and SW2. SW3 and SW4 are physically very small to minimize switching losses. SW3 and SW4 drive an open circuit so that load current is negligible, therefore making conductive losses negligible. Since there are negligible losses, the DC output of the switches SW3 and SW4 is substantially equal to the ideal $D^*V_{IN}$. The DC value may be obtained, for example, by low pass filtering or integrating the pulse modulated waveform.

Figure 3:
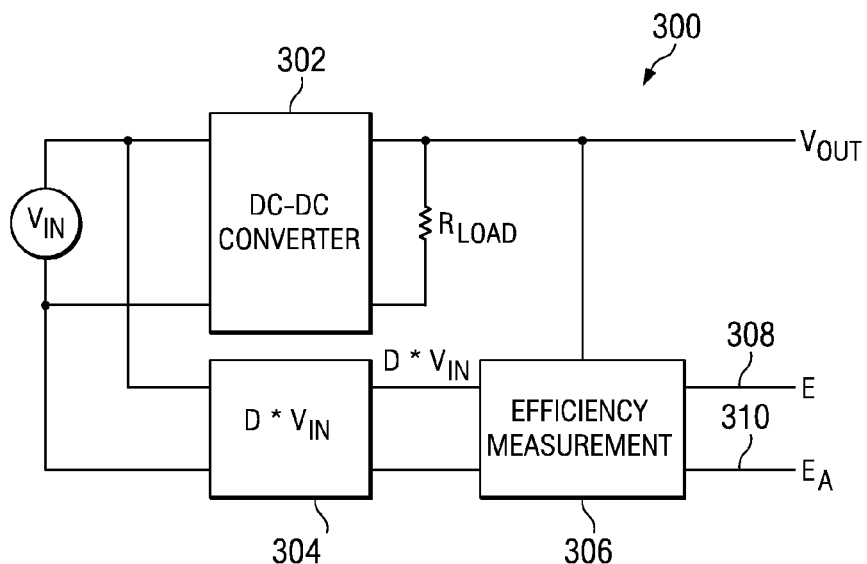
FIG. 3 is a block diagram illustrating an example embodiment of a DC-DC converter having an output that is a measure of efficiency.

For efficiency measurement, given $D^*V_{IN}$, the ratio of $V_{OUT}$ to $D^*V_{IN}$ needs to be determined. FIG. 3 illustrates a DC-DC converter 300 having a digital efficiency output of E (308) (where $E=V_{OUT}/(D^*V_{IN})$). In FIG. 3, block 302 depicts switching circuitry, low-pass filtering, and feedback circuitry, which may be as illustrated in FIG. 1A but may also be other switching DC-DC converter configurations (for example, LLC). In FIG. 3, block 304 depicts circuitry to generate $D^*V_{IN}$, which may be as illustrated in FIG. 2. Finally, block 306 depicts efficiency measurement circuitry to generate a digital value of efficiency E (308). Efficiency measurement circuit 306 may comprise analog-to-digital conversion of $V_{OUT}$ and analog-to-digital conversion of $D^*V_{IN}$ followed by digital computation of the ratio. However, in the following discussion, the digital value of the ratio is directly generated. Alternatively, or in addition to, efficiency measurement circuit 306 may generate an analog value of efficiency $E_A$ (310), which will be discussed in more detail in conjunction with FIG. 8.

Figure 4:
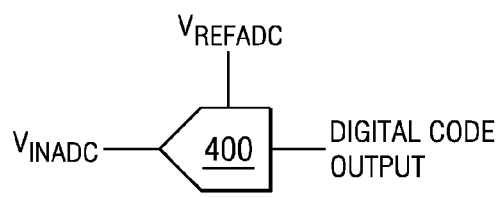
FIG. 4 is a block diagram illustrating an example embodiment of an analog-to-digital converter.

FIG. 4 is a simplified block diagram of an analog-to-digital converter (ADC). $V_{REFADC}$ is a reference voltage that corresponds to the full-scale range of the ADC. Assuming "n" bits of resolution for the digital code output, the output is:

$$\text{Digital Code Output} = V_{INADC} * \frac{2^n}{V_{REFADC}}; \text{ where } V_{INADC} \le V_{REFADC}.$$

In typical usage of an ADC, $V_{REFADC}$ is fixed, and may or may not be an external input. However, for purposes of computing a voltage ratio for efficiency, $V_{REFADC}$ may be a variable input. That is, if $V_{OUT}$ in FIG. 3 is coupled to $V_{INADC}$ in FIG. 4, and if $D^*V_{IN}$ in FIG. 3 is coupled to $V_{REFADC}$ in FIG. 4, then:

$$\text{Digital Code Output} = V_{OUT} * \frac{2^n}{D * V_{IN}}$$

Figure 5:
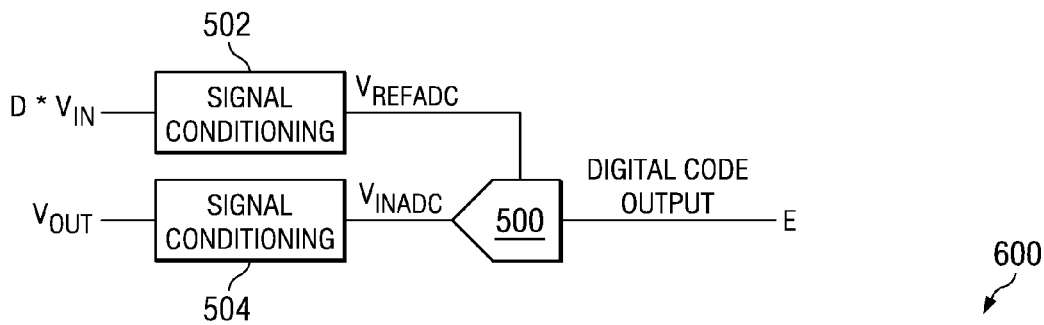
FIG. 5 is a block diagram illustrating an analog-to-digital converter configured to generate a measure of efficiency.

Accordingly, by making $V_{REFADC}$ a variable input, an ADC can be used to directly provide a digital value of the voltage ratio that is a measure of efficiency. FIG. 5 illustrates $D^*V_{IN}$ and $V_{OUT}$ coupled to an ADC 500 to generate a digital measure of efficiency signal E. In FIG. 5, $D^*V_{IN}$ passes through signal conditioning circuitry 502, and $V_{OUT}$ passes through signal conditioning circuitry 504, which will be explained in more detail below in conjunction with FIGS. 7C and 7D.

Figure 6:
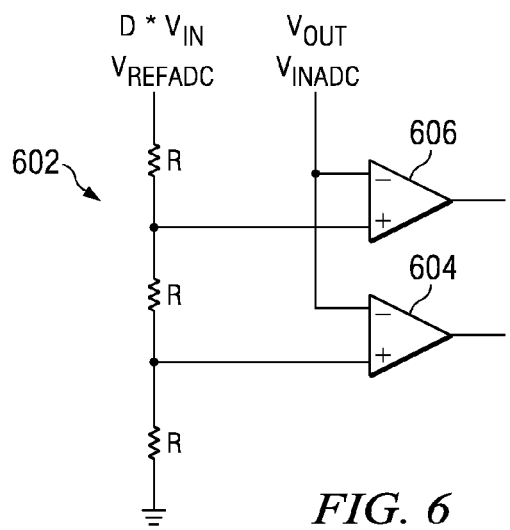
FIG. 6 is a block diagram illustrating an example embodiment of a flash analog-to-digital converter configured to determine a voltage ratio for a measure of efficiency.

FIG. 6 illustrates an example of an ADC configured to generate a digital measure of efficiency. In FIG. 6, ADC 600 is a flash ADC, simplified for purposes of illustration. In FIG. 6, $V_{REFADC}$ (coupled to $D^*V_{IN}$) is divided into thirds by a resistor ladder 602. Comparators 604 and 606 compare fractions of $D^*V_{IN}$ to $V_{OUT}$. The output of comparator 604 is a "one" if $V_{OUT}$ is greater than or equal to $\frac{1}{3}*D*V_{IN}$. The output of comparator 606 is a "one" if $V_{OUT}$ is greater than or equal to $\frac{2}{3}*D*V_{IN}$. An actual flash ADC has additional digital logic, and the resistor ladder may be different, but FIG. 6 illustrates how $V_{REFADC}$ may be a variable input, and how an ADC can provide a digital output of the ratio of $V_{OUT}/(D^*V_{IN})$.

Figure 7A:
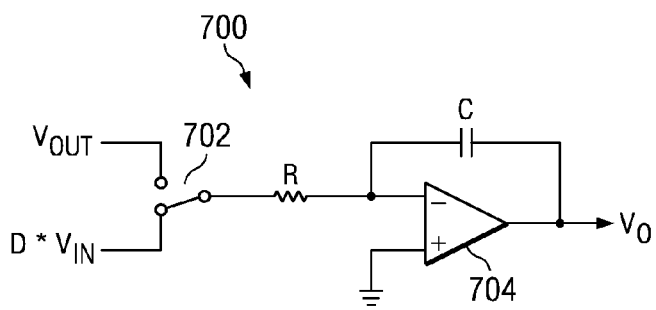
FIG. 7A is a block diagram illustrating an alternative example embodiment of a dual-slope integrating analog-to-digital converter configured to determine a voltage ratio for a measure of efficiency.

FIG. 7A illustrates an alternative example of an ADC configured to generate a digital measure of efficiency. In FIG. 7A, ADC 700 is a dual-slope integrating ADC, simplified for purposes of illustration. A dual-slope integrating ADC is typically used to measure an unknown input voltage, for example in a voltmeter. In the typical usage, an unknown input voltage is applied to the input of an integrator, and the integrator is allowed to ramp up for a fixed amount of time. Then, a known reference voltage of the opposite polarity is applied to the input of the integrator, and the integrator is allowed to ramp down for a variable amount of time until the integrator output returns to zero. The unknown input voltage is determined by the product of the known input voltage times the ratio of two times. However, the dual-slope integrating ADC 700 illustrated in FIG. 7A is being used in a novel atypical manner. For the dual-slope integrating ADC of FIG. 7A, both input voltages may be unknown, and the output is the digital value of the voltage ratio, which is a measure of efficiency.

Figure 7B:
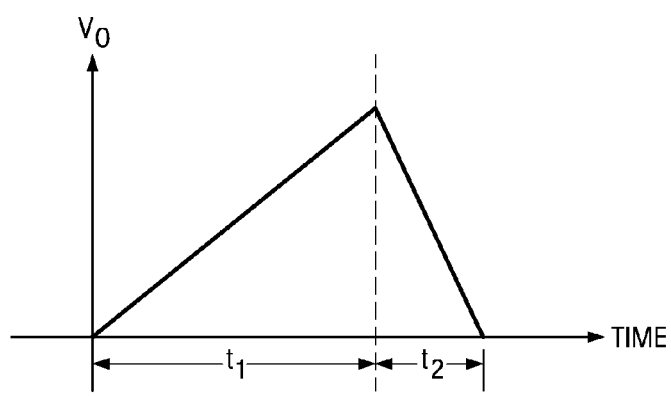
FIG. 7B is an example timing diagram for the example embodiment of FIG. 7A.

FIG. 7B illustrates example timing for the circuit of FIG. 7A. In FIG. 7A, a switch 702 connects one of two input voltages to an integrating operational amplifier 704. In FIGS. 7A and 7B, the two input voltages $V_{OUT}$ and $D^*V_{IN}$ are assumed to be of opposite polarity. Assume that during time t1, switch 702 connects integrating amplifier 704 to $V_{OUT}$, and assume that $V_{OUT}$ is negative. The integrator is inverting, so the output $V_O$ of the integrator increases linearly. Assume that during time t2, switch 702 connects integrating amplifier 704 to $D^*V_{IN}$, and assume that $D^*V_{IN}$ is positive. The output $V_O$ of the inverting integrator decreases linearly. Time t1 is a fixed predetermined amount of time. Time t2 is variable, and ends when a comparator (not illustrated) determines that $V_O$ has returned to zero. A counter (not illustrated) counts clock cycles during the time periods t1 and t2.

The output voltage $V_O$ during time t1 is:

$$V_O = -\frac{V_{OUT}}{RC}t$$

The output voltage $V_O$ during time t2 is:

$$V_O = -\frac{D*V_{IN}}{RC}t$$

Output voltage Vo changes by the same magnitude over time periods t1 and t2. Accordingly:

$$\frac{V_{OUT}}{RC} t1 = \frac{D*V_{IN}}{RC} t2$$

$$\frac{V_{OUT}}{D*V_{IN}} = \frac{t2}{t1}$$

The digital efficiency E is the count of clock cycles during time period t2. Time period t1 is predetermined and known, so it can be set to a convenient number of clock cycles. For example, if t1 is 100 clock cycles, then the number of clock cycles during time period t2 directly expresses the efficiency without scaling. If t1 is, for example, 1,000 clock cycles, then the number of clock cycles during time period t2 must be scaled down by a factor of 10, and so forth.

In FIG. 5, the input voltages to the ADC 500 are modified by signal conditioning circuitry 502 and 504. As discussed above, for the example of FIG. 7A, the input voltages need to be of opposite polarity, so one of $V_{OUT}$ or $D*V_{IN}$ needs to be amplified by a gain of minus one. In addition, $D*V_{IN}$ is a pulse-width-modulated signal. Accordingly, for the examples of FIGS. 6 and 7A, it may be preferable to pass $D*V_{IN}$ through a low-pass filter before going to the ADC. In addition, $D*V_{IN}$ and $V_{OUT}$ may equal or exceed the power supply voltage of the ADC. Accordingly, $D*V_{IN}$ and $V_{OUT}$ may need to be attenuated before conversion. If, for example, the ADC is powered by the output voltage of the DC-DC converter ($V_{OUT}$), then both $V_2$ and $V_{OUT}$ need to be attenuated by equal amounts before conversion. For example, the inputs may be attenuated by a factor of 2, and if both are attenuated equally the ratio will not be affected.

FIG. 7C illustrates an example embodiment of additional detail for an efficiency circuit 306 in FIG. 3, using the dual-slope ADC 700 of FIG. 7A, and the example signal modifications discussed above. In FIG. 7C, as an example of signal modification 504 in FIG. 5, $V_{OUT}$ is amplified by a gain of minus one by an inverting amplifier 702. In FIG. 7C, as an example of signal modification 502 in FIG. 5, $D*V_{IN}$ is filtered by a low-pass filter 704. A simple single-stage R-C filter is illustrated, but multiple-stage or other low-pass filter configurations may be used. $D*V_{IN}$ and $V_{OUT}$ may also need to be attenuated (not illustrated). A counter 706 counts clock cycles from a clock 708 during time periods t1 and t2 (FIG. 7B), and the digital efficiency signal E (FIG. 3, 308) is the number of clock cycles during time period t2.

Figure 7D:
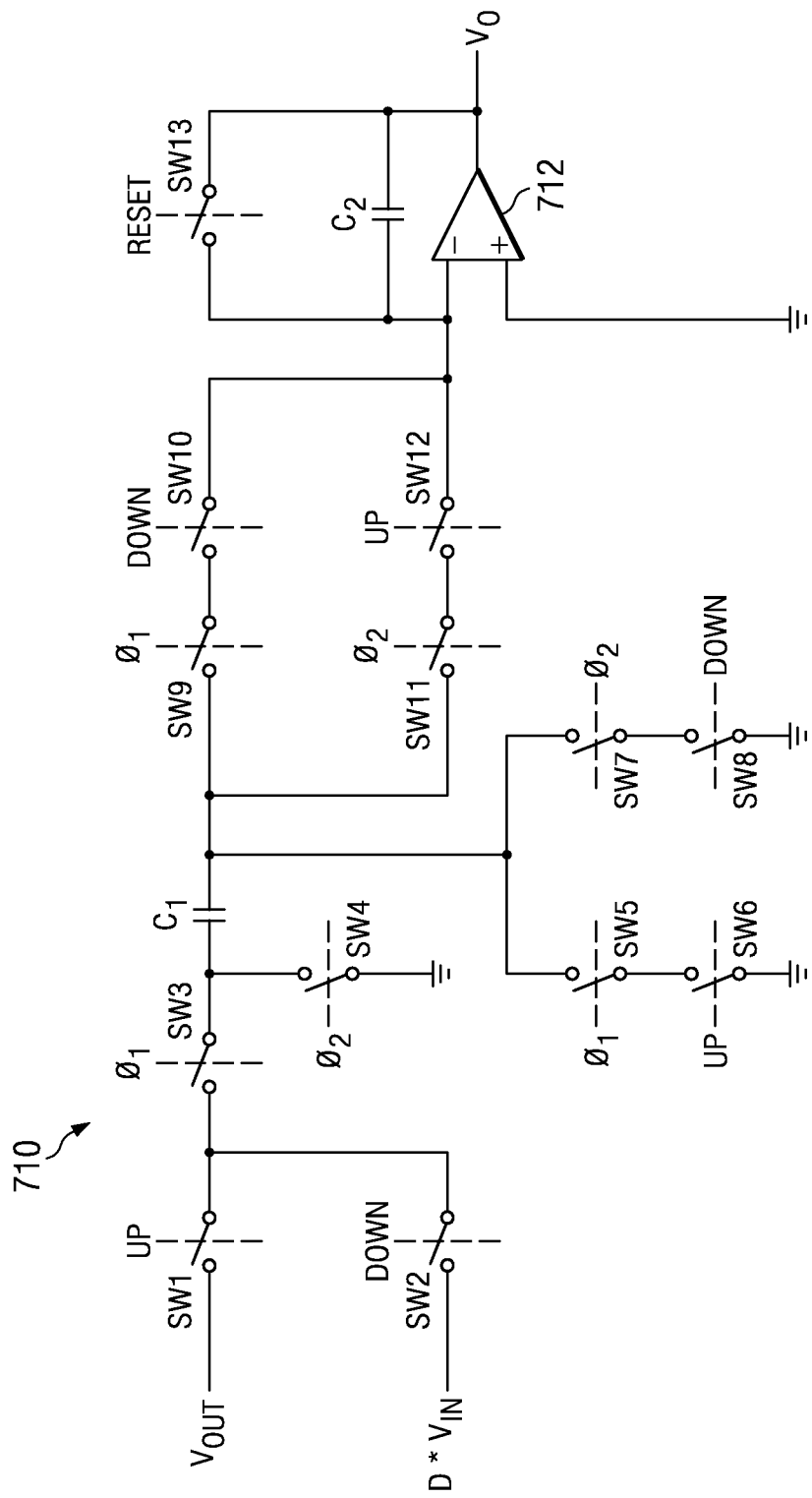
FIG. 7D is a block diagram illustrating additional detail for an alternative example embodiment of a dual-slope integrating analog-to-digital converter configured to determine a voltage ratio for a measure of efficiency.

The example embodiment of FIG. 7A assumes that the integrating operational amplifier 704 is powered by both positive and negative voltages, and accordingly one of the input voltages is amplified by a gain of minus one. In a DC-DC converter, the integrating operational amplifier (FIG. 7A, 704) may need to be powered by a single voltage, for example, the output of the DC-DC converter ($V_{OUT}$). FIG. 7D illustrates an example alternative embodiment for a dual-slope integrating ADC 710 for the case in which the integrating operational amplifier is powered by a single voltage. The example of FIG. 7D is a switched-capacitor dual-slope integrating ADC. For the example of FIG. 7D, there is a two-phased clock signal ($Ø_1$, $Ø_2$) and an UP/DOWN control signal. Capacitor $C_1$ is a switched capacitor, which may be much smaller than the integration capacitor $C_2$. Initially, the UP/DOWN signal is set to UP. During the UP period, during clock phase $Ø_1$, switches SW1 and SW3 connect one side of capacitor $C_1$ to $V_{OUT}$ and switches SW5 and SW6 connect the other side of $C_1$ to ground. Capacitor $C_1$ then charges to $V_{OUT}$.

Then, during clock phase $Ø_2$, switch SW4 switches one side of $C_1$ to ground and switches SW11 and SW12 connect the other side of $C_1$ to $C_2$ and the operational amplifier 712. The side of $C_1$ connected to $C_2$ is then $-V_{OUT}$. During clock phase $Ø_2$, the charge on $C_1$ is transferred to $C_2$ as the operational amplifier drives its input to ground, and $V_O$ increases by an incremental amount proportional to $V_{OUT}$. This is repeated for known fixed number of clock cycles, for example, 128 cycles for a 6-bit digital output. After the known fixed number of clock cycles the UP/DOWN signal is changed to DOWN. During the DOWN period, during clock phase $Ø_1$, switches SW2 and SW3 connect one side of capacitor $C_1$ to $D*V_{IN}$ and switches SW9 and SW10 connect the other side of capacitor $C_1$ to $C_2$ and the input of the operational amplifier 712. During clock phase $Ø_1$, an amount of charge is transferred from $C_2$ to $C_1$ as the operational amplifier drives its input to ground and $C_2$ is charged to $D*V_{IN}$, and $V_O$ decreases by an incremental amount proportional to $D*V_{IN}$. During clock phase $Ø_2$, both sides of capacitor $C_1$ are grounded (switches SW4, SW7, SW8) so $C_1$ is discharged. This is repeated for an unknown variable number of clock cycles until $V_O$ is zero. The number of clock cycles required to return $V_O$ to zero is the digital output. Switch SW13 and signal RESET provide a reset function. The example of FIG. 7D eliminates the need for an inverting input signal amplifier as in amplifier 702 in FIG. 7C. Again, $V_{OUT}$ and $D*V_{IN}$ may need to be attenuated (not illustrated) and/or low-pass filtered (not illustrated) and/or buffered (not illustrated).

In the examples of FIGS. 3, 5, and 7C, the efficiency signal E (308) is a digital value. This value may be, for example, communicated over a bus to a test system or to a system controller. Alternatively, an analog efficiency signal may be provided, for example, as a voltage. In FIG. 8, the digital efficiency signal E (308) (from, for example FIG. 3, 5, or 7C) is converted by a digital-to-analog converter 800 to an analog voltage efficiency signal $E_A$ (310).

FIG. 9 illustrates a method 900 for generating a measure of efficiency by a DC-DC converter. At step 902, the DC-DC converter determines a measure of efficiency of the DC-DC converter. At step 904, the DC-DC converter outputs the measure of efficiency.

While certain embodiments of a DC-DC converter have been described in detail herein, it will be obvious to those skilled in the art, after reading this disclosure, that a DC-DC converter may be variously otherwise embodied within the scope of the claims. The appended claims are to be construed to cover such alternative embodiments, except to the extent limited by the prior art.

What is claimed is:
1. A DC-DC converter, comprising:
    an efficiency measurement circuit having an output that is a measure of efficiency of the DC-DC converter;
    the DC-DC converter receiving a DC input voltage and generating a DC output voltage;
    a first switching circuit converting the DC input voltage to a second DC voltage; and
    a second switching circuit converting the DC input voltage to a third DC voltage; and
    the efficiency measurement circuit determining a ratio of the DC output voltage to the third DC voltage as the measure of efficiency.
2. The DC-DC converter of claim 1, further comprising:
    the first switching circuit having a duty cycle; and
    the third DC voltage being substantially equal to the duty cycle times the DC input voltage.

3. The DC-DC converter of claim 1, further comprising:
the first switching circuit having a duty cycle;
the second switching circuit having the same duty cycle as the first switching circuit; and
the second switching circuit having a load that is negligible.

4. The DC-DC converter of claim 1, the efficiency measurement circuit further comprising:
an analog-to-digital converter (ADC) having an ADC analog voltage input coupled to the DC output voltage, and an ADC reference voltage input coupled to the third DC voltage.

5. The DC-DC converter of claim 4, the efficiency measurement circuit further comprising:
a low-pass filter between the third DC voltage and the ADC analog voltage input.

6. The DC-DC converter of claim 4, the ADC further comprising a dual-slope integrating ADC.

7. The DC-DC converter of claim 6, the efficiency measurement circuit further comprising:
circuitry to switch direction of integration for one of the input voltages to the ADC.

8. The DC-DC converter of claim 7, the ADC further comprising a switched-capacitor dual-slope integrating ADC.

9. The DC-DC converter of claim 6, the efficiency measurement circuit further comprising:
a clock signal;
a counter, counting cycles of the clock signal; and
a digital output signal that is the number of clock cycles counted by the counter during an integration period of the dual-slope integrating ADC.

10. The DC-DC converter of claim 1, further comprising:
the output of the efficiency measurement circuit being a digital value; and
a digital-to-analog converter converting the output of the efficiency measurement circuit to an analog measure of efficiency signal.

11. A method, comprising:
determining, in a DC-DC converter, a measure of efficiency of the DC-DC converter;
outputting, by the DC-DC converter, the measure of efficiency; further comprising:
generating, by the DC-DC converter, an output voltage;
generating, by the DC-DC converter, an intermediate voltage between the input voltage and the output voltage;
determining, by the DC-DC converter, the ratio of the output voltage to the intermediate voltage; and
outputting, by the DC-DC converter, the ratio as the measure of efficiency.

12. The method of claim 11, further comprising:
outputting, by the DC-DC converter, the measure of efficiency as a digital value.

13. The method of claim 11, further comprising:
outputting, by the DC-DC converter, the measure of efficiency as an analog value.

14. The method of claim 11, further comprising:
coupling the output voltage to an analog input voltage of an ADC; and
coupling the intermediate voltage to a reference input voltage of the ADC.

* * * * *